United States Patent [19]

Arao et al.

[11] Patent Number: 4,964,211
[45] Date of Patent: Oct. 23, 1990

[54] PARTS ASSEMBLING APPARATUS

[75] Inventors: Masaki Arao, Nagaokakyo; Shinichiro Tsunemi, Takatsuki, both of Japan

[73] Assignee: Omron Tateisi Electronics Co., Kyoto, Japan

[21] Appl. No.: 366,292

[22] Filed: Jun. 13, 1989

Related U.S. Application Data

[63] Continuation-in-part of Ser. No. 48,611, May 11, 1987, abandoned.

[30] Foreign Application Priority Data

May 14, 1986 [JP] Japan ................................ 61-111335

[51] Int. Cl.$^5$ ....................... B23Q 21/00; B23Q 15/00
[52] U.S. Cl. ......................... 29/705; 29/739; 29/741
[58] Field of Search ........................ 29/739, 741, 705

[56] References Cited

U.S. PATENT DOCUMENTS

| | | | |
|---|---|---|---|
| 4,401,294 | 8/1977 | Inoyama et al. | 29/709 X |
| 4,510,683 | 4/1985 | Fedde et al. | 29/701 |
| 4,621,419 | 11/1986 | Hino et al. | 29/741 X |

Primary Examiner—Timothy V. Eley
Attorney, Agent, or Firm—Dickstein, Shapiro & Morin

[57] ABSTRACT

A parts assembling apparatus for assembling an electronic part onto a printed circuit board by inserting leg portions such as lead pins of the part into the assembling holes formed in the board comprises a movable arm, holding mechanism, force sensor and discrminating device. A part is held at a preset position by the holding mechanism which is vertically reciprocated by the movable arm to the part assembling position over the board. The reaction force from the board which acts on the holding mechanism is detected by the force sensor when the part is assembled. On the basis of the sensor output, the discriminating device determines whether the lead pins have been correctly inserted into the part assembling holes of the board or not.

9 Claims, 6 Drawing Sheets

PARTS ASSEMBLING APPARATUS

This application is a continuation-in-part of application Ser. No. 048,611, filed May 11, 1987, abandoned.

BACKGROUND OF THE INVENTION

The present invention relates to a parts assembling apparatus which is used to assemble electronic parts or the like onto a printed circuit board and the like by, for example, inserting leg portions of the electronic part or the like into assembling holes formed in the printed circuit board. More particularly, the invention relates to a novel apparatus and method which can detect the defective insertion of the leg portions of the par into the assembling holes formed in the printed circuit board.

Such a kind of conventional parts assembling apparatus has a movable arm. A holding mechanism is attached to the end of the movable arm. An electronic part such as IC part or the like is held by the holding mechanism and moved to the location over the part assembling position of the printed circuit board. Thereafter, by lowering the movable arm, the leg portions (e.g., lead pins) of the electronic part are inserted into the assembling holes formed in the printed circuit board. In this manner, the electronic part is assembled onto the printed circuit board. After the part is correctly assembled, the holding mechanism releases the electronic part and the movable arm is lifted up to be returned to the original standby position.

In this apparatus, it is necessary to check whether the leg portions of the electronic part were correctly inserted into the assembling holes of the printed circuit board or not. However, hitherto, the inserting state of the leg portions of the part into the assembling holes has been discriminated by checking whether the movable arm has been put down to a predetermined height position or not when the part is assembled.

However, according to this way of discrimination, for example, even in the case where although some of a plurality of leg portions of the electronic part were correctly inserted into the assembling holes of the printed circuit board, the remaining leg portions were bent at improper positions, the movable arm descends to the predetermined height position, so that this improper state will be misjudged to be the correct state.

When the bent leg portion comes into contact with the land portion around the assembling hole, the defective insertion of the leg portion cannot be detected by a testing device such as incircuit tester or the like. Therefore, there is such a possibility that the article including the defective electronic part is put on the market as it is. If a vibration or the like is applied to this article after that, the leg portion is removed from the land portion, causing a problem such that a failure of the article occurs or the like.

SUMMARY OF THE INVENTION

It is an object of the present invention to provide a parts assembling apparatus which can certainly discriminate the defective insertion of the leg portions of a part into the assembling holes by detecting the reaction force from the board by a force sensor when the part is assembled.

A parts assembling apparatus according to the present invention comprises: a holding mechanism to hold a part having leg portions at a predetermined position; a moving member to reciprocate the holding mechanism to the part assembling position of a board in which assembling holes are formed; a force sensor to detect the reaction force from the board which acts on the holding mechanism when the part is assembled; and discriminating means for discriminating on the basis of an output of the force sensor whether the leg portions of the part have been correctly inserted into the assembling holes or not.

When a part is assembled, the holding mechanism supported to the moving member holds the part and is positioned over the part assembling position of the board. When the moving member descends, if the leg portions of the part are normal, the leg portions of the part are smoothly inserted into the assembling holes of the board. However, if the position of the part is deviated from the board or some of the leg portions of the part are deformed, a part of the leg portions is not inserted into the corresponding assembling hole but is bent on the surface of the board. In this case, the reaction force from the board in magnitude and the change state of time is different from those in the case where this leg portion is normal. This reaction force is detected by the force sensor. The discriminating means discriminates on the basis of the detection output of the force sensor whether the leg portion has been correctly inserted into the assembling holes or not.

As described above, according to the present invention, the reaction force from the board which acts on the part holding mechanism is detected by the force sensor. On the basis of the output of the force sensor, it is discriminated whether the leg portions of the part have been correctly inserted into the assembling holes of the board or not. Therefore, even if one or some of a plurality of leg portions of the part were bent at proper positions due to the defective insertion, the defective insertion of the leg portion into the assembling hole can be certainly detected On the other hand, according to the present invention, it is possible to detect not only the defective insertion of the leg portion of the part but also the abnormal assembling state due to the contact with the adjacent part, the deviation of the position of the automatic assembling apparatus onto the board, and the like. Thus the defective assembling state of the parts onto the board can be reduced. The number of processes to check the defective insertion by the observation is reduced. The costs of articles can be decreased and the like. Many advantages can be obtained as described above.

DETAILED DESCRIPTION OF A PREFERRED EMBODIMENT

Figure 1:
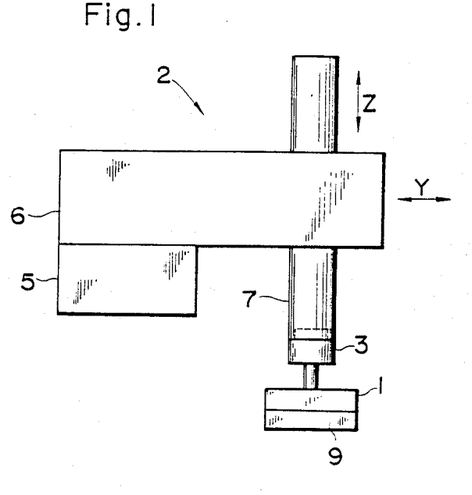
FIG. 1 is a side elevational view showing a whole parts assembling apparatus according to an embodiment of the present invention.
Figure 2:
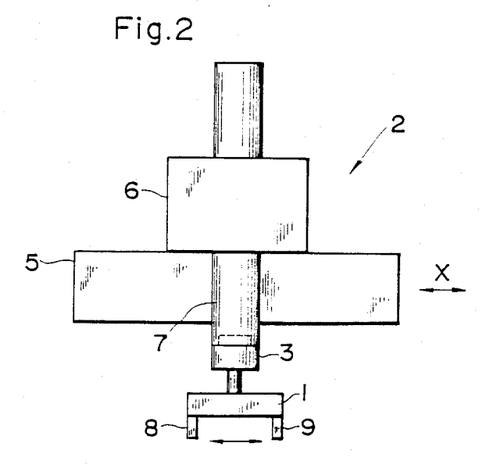
FIG. 2 is a front view of the apparatus of FIG. 1.

FIGS. 1 and 2 show a constitution of a whole parts assembling apparatus according to an embodiment of the present invention.

The parts assembling apparatus shown in the diagram assembles an electronic part A such as IC or the like onto a printed circuit board B (refer to FIGS. 7 and 8) by together inserting leg portions $a_1$ to $a_6$ (in this case, lead pins) of the electronic part A into a plurality of assembling holes $b_1$ to $b_6$ formed in the printed circuit board B. However, the present invention is not limited to only this apparatus but can be also applied to other apparatus to assemble other parts than the electronic part A or to assemble parts to other member than the printed circuit board B.

The parts assembling apparatus shown in the diagrams has such a structure that a holding mechanism 1 is attached to the end of a moving member 2 through a force sensor 3. The moving member 2 consists of three movable arms 5, 6 and 7. The arm 5 is supported to a frame (not shown) of the apparatus. The arm 6 is supported to the arm 5. The arm 7 is supported to the arm 6. The holding mechanism 1 is supported by the arms 5 to 7 so as to be movable in three directions X, Y and Z which cross perpendicularly.

The holding mechanism 1 has two finger members 8 and 9 which are disposed so as to face each other and to hold the electronic part A. The finger members 8 and 9 are closed or opened to hold or release the electronic part A.

Figure 3:
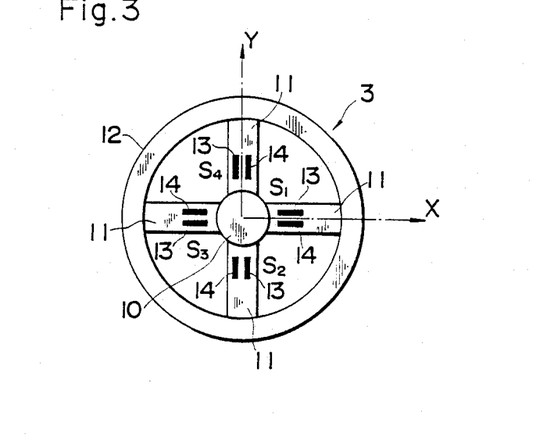
FIG. 3 is a plan view showing an example of a constitution of a force sensor.
Figure 4:
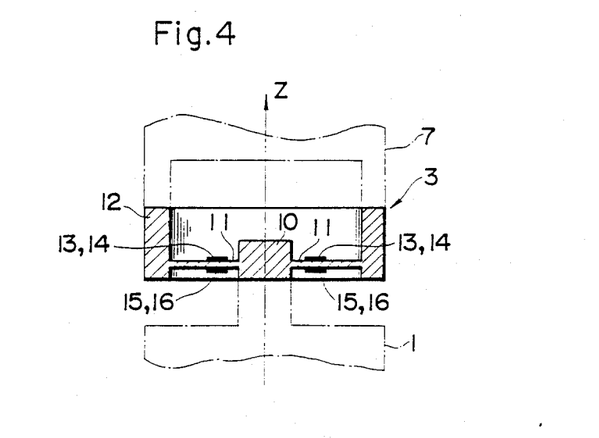
FIG. 4 is a vertical sectional view of the force sensor of FIG. 3.

As shown in FIGS. 3 and 4, the force sensor 3 has such a structure that four elastic beams 11 are radially arranged around a central axis portion 10 at the equal angular positions of 90°, and the end of each elastic beam 11 is coupled with a ring-shaped coupling portion 12. Every two strain gauges 13 to 16 are adhered to the front and back surfaces of each elastic beam 11. Namely, a set of total four strain gauges 13 to 16 are adhered to the front and back surfaces of each elastic beam 11. These sets of strain gauges function as detectors $S_1$ to $S_4$ to detect the bending distortion, respectively.

Among the forces and moments which act on the central axis portion 10, the force sensor 3 can detect the force $F_Z$ in the direction of a Z axis and the moments $M_X$ and $M_Y$ around X and Y axes. The holding mechanism 1 is coupled with the central axis portion 10. The arm 7 is coupled with the ring-shaped coupling portion 12.

Figure 5:
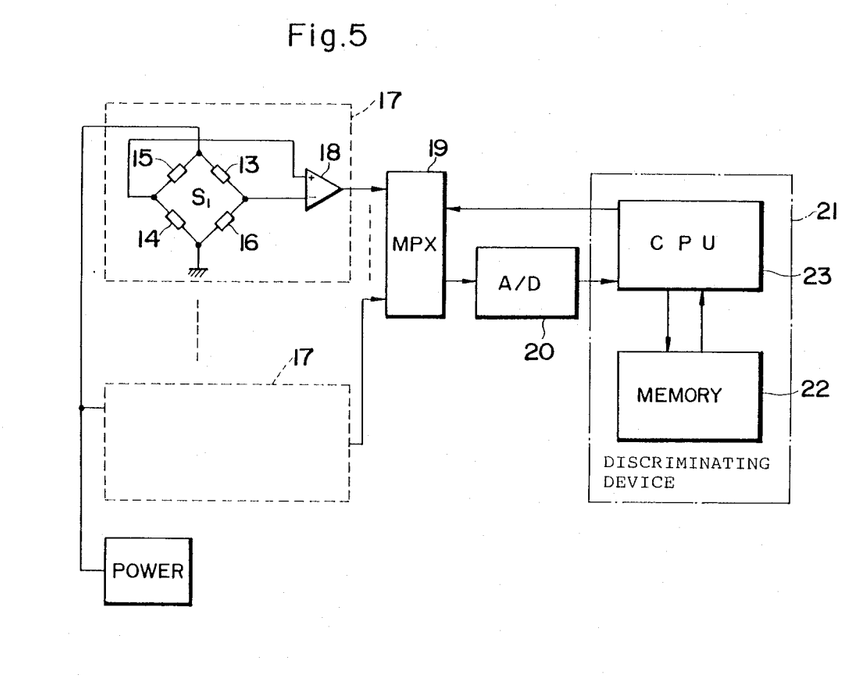
FIG. 5 is a block diagram showing constitutions of a force detecting circuit and a discriminating device.

Each set of strain gauges 13 to 16 are adhered to each elastic beam 11 constitutes a wheatstone bridge circuit 17 as shown in FIG. 5, each of the circuits 17 corresponding to each of detectors $S_1$ to $S_4$. Total four outputs of the detectors $S_1$ to $S_4$ are respectively input to a multiplexer 19 through an amplifier 18 and are further sequentially supplied to a discriminating device 21 through an A/D converter 20. The multiplexer 19 is controlled by the discriminating device 21.

The discriminating device 21 executes predetermined arithmetic operations to calculate the force $F_Z$ in the direction of the Z axis and the moments $M_X$ and $M_Y$ around the X and Y axes as necessary and also discriminates whether the leg portions of the electronic part A have been correctly inserted into assembling holes of the printed circuit board B or not on the basis of the magnitude of the force $F_Z$ and the time change state thereof.

The discriminating device 21 comprises a memory 22 and a CPU (central processing unit) 23. Discrimination reference data and the like to discriminate the inserting states of the leg portions of the part are previously stored in the memory 22. The CPU 23 compares the calculated data or the like of the force $F_Z$ with the discrimination reference data, thereby discriminating whether the leg portions of the part have been correctly inserted or not. Then, CPU 23 also executes the process according to the result of the discrimination.

Figure 6:
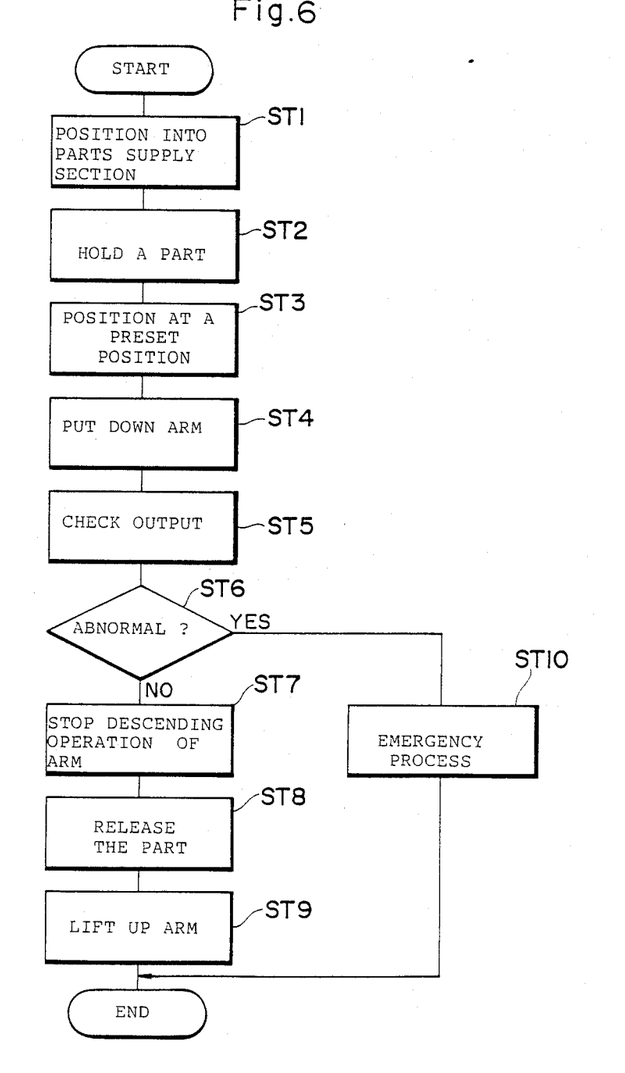
FIG. 6 is a flowchart showing a procedure for the part assembling operation.

FIG. 6 shows a procedure for the operation of the parts assembling apparatus.

In step 1 (ST1) in FIG. 6, the movable arms 5 to 7 of the moving member 2 are driven to lead the holding mechanism 1 to a parts supply section (not shown). In step 2, the holding mechanism 1 holds one electronic part A prepared in the parts supply section. In step 3, the arms 5 to 7 of the moving member 2 are driven to move and position the holding mechanism 1 to the position over the printed circuit board B.

Figure 7:
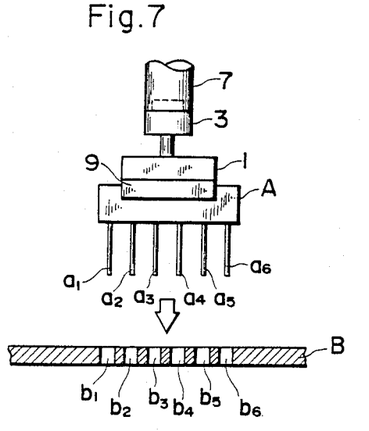
FIGS. 7 and 8 are explanatory diagrams showing a part assembling situation.

FIG. 7 shows such a positioning state. The electronic part A is horizontally held by the holding mechanism 1 and the leg portions $a_1$ to $a_6$ of the electronic part A are arranged so as to face the assembling holes $b_1$ to $b_6$ formed in the printed circuit board B.

In the next step 4, the movable arm 7 descends to move the electronic part A toward the printed circuit board B. At the same time, in step 5, the discriminating device 21 checks the detection output of the force sensor 3 to see if the leg portions $a_1$ to $a_6$ have been correctly inserted into the assembling holes $b_1$ to $b_6$ or not.

Figure 9:
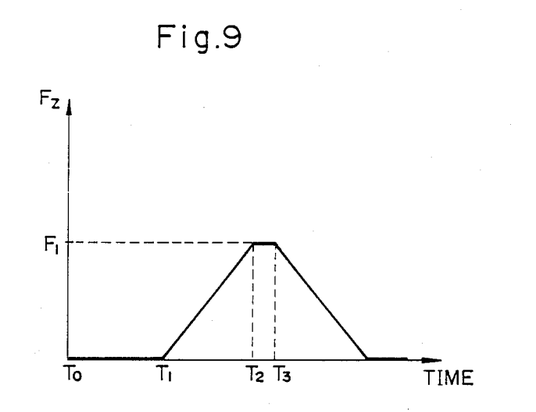
FIG. 9 is a graph showing a change in reaction force under the normal condition.

FIG. 9 is a graph showing the change in the force $F_Z$ in the direction of the Z axis to the elapsed time in the case where the leg portions were correctly inserted.

In FIG. 9, the movable arm 7 first starts descending at time $T_0$. However, the force $F_Z$ in the direction of the Z axis is zero or has a value near zero until the main body portion (the portion other than the leg portions) of the electronic part A is come into contact with the printed circuit board B at time $T_1$. Since the movable arm 7 continues descending for a little while even after the main body portion of the electronic part A touched the printed circuit board B, the board B is bent by the pressing force. The reaction force acts on the force sensor 3 as the force $F_Z$ in the Z axis direction.

The force $F_Z$ gradually increases for the period of time $T_1$ and $T_2$. However, even if the movable arm 7 has reached a preset descending position, when the magnitude $F_1$ of the force $F_Z$ is smaller than the discrimination reference data $F_2$ (refer to FIG. 10), the answer is NO in the discriminating step 6 in FIG. 6 to see if the output is abnormal or not. The descending operation of the arm 7 is stopped in step 7. In the next step 8, the holding mechanism 1 is opened to release the electronic part A. Then, when the arm 7 starts ascending in step 9, the force $F_Z$ gradually decreases.

Figure 10:
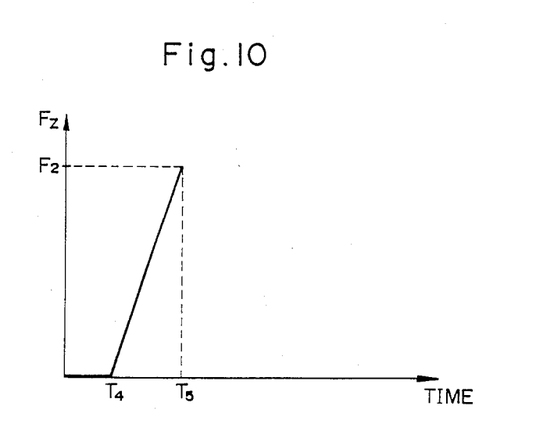
FIG. 10 is a graph showing a change in force under the abnormal condition.

FIG. 10 is a graph showing the change state in the force $F_Z$ when the leg portions were not correctly inserted.

Figure 8:
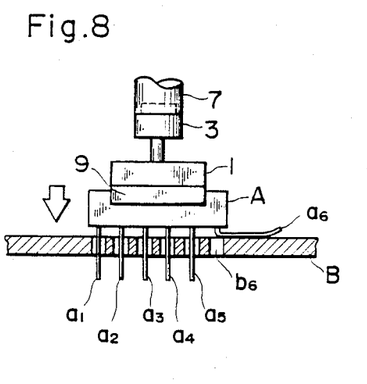

Now, assuming that the leg portion $a_6$ of the electronic part A was deformed as shown in FIG. 8, only the leg portion $a_6$ abuts on the surface of the printed circuit board B and is bent while the movable arm 7 is descending, so that the leg portion $a_6$ is not inserted into the corresponding assembling hole $b_6$. Therefore, the force sensor 3 starts detecting the reaction force from the printed circuit board B at early time $T_4$ before the main body portion of the electronic part A touches the printed circuit board B. This reaction force gradually increases and the value of the force $F_Z$ in the Z axis direction reaches the discrimination reference data $F_2$ at time $T_5$. Thus, the answer is YES in step 6 in FIG. 6. The emergency processing operation is started in step 10.

For example, although the following processes (1) and (2) are considered as the emergency processing operation, this operation is not limited to them.

(1) The descending operation of the movable arm 7 is stopped and then the arm 7 is lifted up to a preset position with the electronic part A held. Thereafter, an alarm is generated to inform the abnormal part and part assembling operation is stopped.

(2) The descending operation of the movable arm 7 is stopped and then lifted up. The arm 7 is moved to the scrapping position of the abnormal part with the electronic part A held. Thereafter, the part A is released and dropped to the scrapping position and collected. Another part is again assemble and if the similar trouble repeatedly occurred a predetermined number of times, an alarm is generated and the part assembling operation is stopped.

In the foregoing embodiment, the abnormal part is discriminated by paying an attention to only the magnitude of the reaction force (force $F_Z$ in the Z axis direction) which acts on the force sensor 3. However, it is also possible to use other discriminating methods whereby, for example, an attention is paid to the elapse of time and when the reaction force was detected within a predetermined time, the part is decided to be the abnormal part, and the like. The foregoing moments $M_X$ and $M_Y$ can be also used as factors to discriminate the abnormal part.

In the foregoing embodiment, the abnormal part is decided when the reaction force from the printed circuit board is larger than a predetermined value when the leg portions of the electronic part A are inserted. However, for example, in the case of the parts assembling apparatus such as a chip mounter of a chip resistor, a flat pack IC, or the like in which a part is pressed and assembled onto the printed circuit board, the abnormal part can be also predetermined when the reaction force of a predetermined magnitude cannot be detected when the movable arm 7 descends. The invention can be also applied to such a case or the like.

Figure 11:
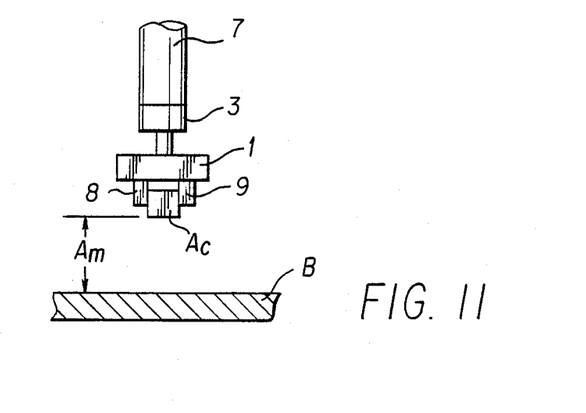
FIG. 11 is a front view of a portion of the FIG. 1 apparatus.
Figure 12A:
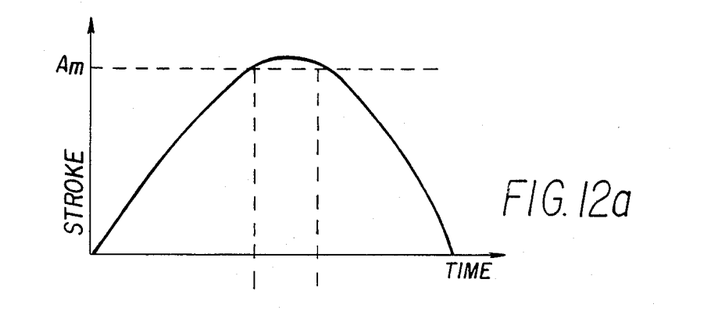
FIG. 12 is a graph showing movement of a stroke arm illustrated in FIG. 11.
Figure 12B:
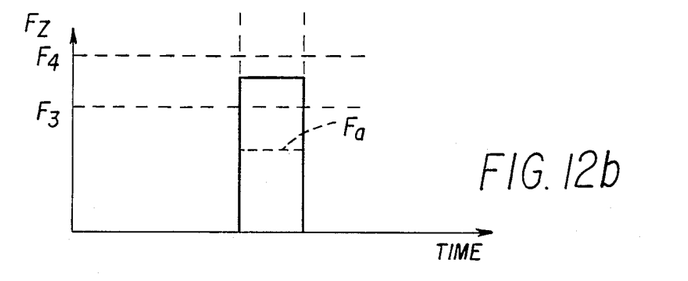
FIG. 12b is a graph of a change in reaction force which occurs during operation of the stroke arm in FIG. 11.

FIGS. 11, 12a, and 12b illustrates another aspect of the invention. With reference to FIG. 11, which shows a portion of the FIG. 1 apparatus, a chip part $A_c$ such as a chip resistor, a flat pack IC and so on is held by the holding mechanism 1 attached to the end of the arm 7 of a chip mounter. The chip part $A_c$ is provided with adhesive on the bottom outer surface thereof. When the arm 7 descends the chip part $A_c$ is pressed against the board B so as to be attached to the board B by the adhesive. The reaction force from the board B is detected by the sensor 3 as the force $F_z$ in the Z axis direction.

FIG. 12a is a graph showing the movement stroke of the arm 7 and FIG. 12b is a graph showing a change in reaction force $F_z$ in the Z axis direction, in which the solid line indicates the reaction force under normal insertion conditions and the dot line $F_a$ shows an abnormal reaction force.

Normally, if the arm 7 moves downward by a predetermined stroke $A_m$, the reaction force $F_z$ exceeds a predetermined value $F_3$. However, if the chip mounter malfunctions and the descendent distance is shorter than the predetermined stroke $A_m$, or the chip part $A_c$ is abnormal so that the chip part barely reaches the board B, the reaction force is never present or the reaction force does not reach the predetermined value $F_3$ as shown by dot line $F_a$. By detecting a force less than $F_3$ an insertion abnormality of the apparatus or of the chip part is detected.

Further it is also possible to judge that the apparatus is functioning normally or that a chip part is inserted normal upon insertion when the reaction force detected lines in the detection range between the predetermined upper limit value $F_4$ and the predetermined lower limit value $F_3$ and to determine an abnormality in the operation of the mounting apparatus or in the insertion of the chip part when the reaction force detected lies above $F_4$ or below $F_3$. The FIG. 5 apparatus and processing illustrated in FIG. 6 can be used to implement this embodiment of the invention. By checking the operation of the chip mounter also through this method, the movement stroke of the arm 7, which is initially correlated with the predetermined upper and lower limit values $F_3$ and $F_4$ as shown in FIGS. 12a and 12b, can be adjusted by a stroke adjusting means so as to provide a normal reaction force.

What is claimed is:

1. A parts assembling apparatus for assembling a part onto a board by pressing the part onto the board, comprising:
   holding means for holding said part at a predetermined position;
   means for moving said holding means to a part assembling position on the board;
   force sensor means for detecting a reaction force from the board which acts on said holding means when said part is pressed onto said board; and
   means for comparing a detection output of said force sensor means with a predetermined reference data when the part is pressed onto said board and for determining an abnormality when a value represented by the detection output does not reach the reference data.

2. A parts assembling apparatus according to claim 1, wherein said board is a printed circuit board.

3. A parts assembling apparatus according to claim 1, wherein said force sensor means comprises a predetermined number of strain gauges respectively secured to each of a plurality of elastic beams which are radially arranged around a central axis at equal angular positions of 90°.

4. A parts assembling apparatus according to claim 1, wherein said moving means is constituted by a combination of three movable arms for moving said holding means in the direction of X, Y and Z, respectively.

5. A parts assembling apparatus for assembling a part onto a board by pressing the part onto the board, comprising:

holding means for holding said part at a predetermined position;
means for moving said holding means to a part assembling position on the board;
force sensor means for detecting a reaction force from the board which acts on said holding means when said part is pressed onto said board; and
means for comparing a detection output of said force sensor means with a predetermined range of reference data when the part is pressed onto said board and for determining an abnormality when a value represented by the detection output resides outside said predetermined range of reference data.

6. A parts assembling apparatus according to claim 5 wherein said predetermined range of reference data is correlated with a predetermined extent of movement of said holding means.

7. A parts assembling apparatus according to claim 5, wherein said board is a printed circuit board.

8. A parts assembling apparatus according to claim 5, wherein said moving means is constituted by a combination of three movable arms for moving said holding means in the directions of X, Y and Z, respectively.

9. A parts assembling apparatus according to claim 5, wherein said force sensor means comprises a predetermined number of strain gauges secured to each of a plurality of elastic beams which are radially arranged around a central axis at equal angular positions of 90°.

* * * * *